United States Patent

Unami et al.

Patent Number: 6,016,024
Date of Patent: *Jan. 18, 2000

[54] PIEZOELECTRIC COMPONENT

[75] Inventors: Toshihiko Unami; Jiro Inoue, both of Omihachiman; Takashi Yamamoto, Ishikawa-ken; Tetsuo Takeshima, Toyama, all of Japan

[73] Assignee: Murata Manufacturing Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/832,072

[22] Filed: Apr. 2, 1997

[30] Foreign Application Priority Data

| Apr. 5, 1996 | [JP] | Japan | 8-110475 |
| Apr. 18, 1996 | [JP] | Japan | 8-122725 |
| Aug. 5, 1996 | [JP] | Japan | 8-223029 |
| Jan. 16, 1997 | [JP] | Japan | 9-020102 |
| Jan. 16, 1997 | [JP] | Japan | 9-020103 |

[51] Int. Cl.[7] .................................................. H01L 41/08
[52] U.S. Cl. ............................................. 310/345; 310/348
[58] Field of Search .................................. 310/345, 348, 310/366, 368

[56] References Cited

U.S. PATENT DOCUMENTS

| 2,157,665 | 5/1939 | Hollmann | 310/315 |
| 2,636,135 | 4/1953 | Peek, Jr. | 310/345 |
| 3,185,869 | 5/1965 | Shoor | 310/315 |
| 3,297,889 | 1/1967 | Breskend | 310/315 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |

(List continued on next page.)

FOREIGN PATENT DOCUMENTS

5-160459   6/1993   Japan ..................... 310/366

*Primary Examiner*—Mark O. Budd
*Assistant Examiner*—Timothy Williams
*Attorney, Agent, or Firm*—Graham & James LLP

[57] ABSTRACT

A piezoelectric component achieves a desired Qm by using a presently available piezoelectric material. The piezoelectric component includes a supporting substrate on which pattern electrodes are provided. Electroconductive supporting members are disposed on the pattern electrodes, and a piezoelectric resonator is mounted on the supporting members. External electrodes of the piezoelectric resonator and the pattern electrodes are electrically connected to each other by the supporting members. Gaps between the piezoelectric resonator and the supporting substrate are filled with a first elastic material element. A second material element may be provided on the surface of the piezoelectric resonator disposed opposite to the surface of the resonator facing the supporting substrate. Only one of these elastic material elements or both these elastic material elements may be used.

18 Claims, 12 Drawing Sheets

U.S. PATENT DOCUMENTS

| | | | |
|---|---|---|---|
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui et al. | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FIG.13
PRIOR ART

PIEZOELECTRIC COMPONENT

BACKGROUND OF THE INVENTION

1. Field of the Invention

The present invention relates generally to piezoelectric components and, more particularly, to a piezoelectric component such as an oscillator, a discriminator or a filter having a piezoelectric resonator adapted to generate longitudinal vibration.

2. Description of the Related Art

Figure 13:
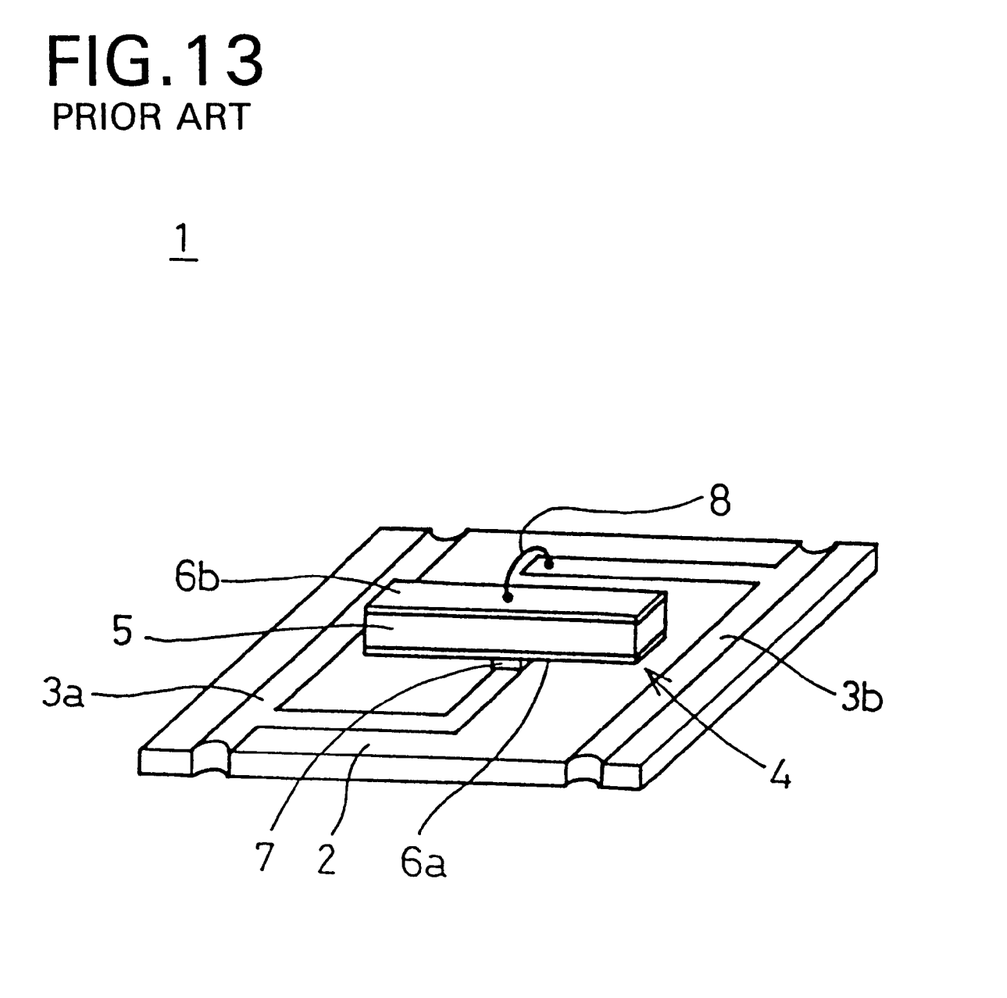
FIG. 13 is an exploded perspective view of a conventional piezoelectric component.

FIG. 13 is a perspective view of a conventional piezoelectric component 1. The piezoelectric component 1 includes a supporting substrate 2 having pattern electrodes 3a and 3b disposed on a surface of the substrate 2. A piezoelectric resonator 4 is supported on the supporting substrate 2. The piezoelectric resonator 4 includes, for example, a vibrating body 5 formed of a piezoelectric material and external electrodes 6a and 6b disposed on two opposite surfaces of the vibrating body 5. When a signal is input between the external electrodes 6a and 6b, vibration in a longitudinal mode is generated in the vibrating body 5. A supporting member 7 is formed of, for example, an electroconductive material on the pattern electrode 3a. A central portion of the piezoelectric resonator 4 is supported by the supporting member 7. Simultaneously, the external electrode 6a of the piezoelectric resonator 4 and the pattern electrode 3a are electrically connected to each other by the supporting member 7. The other external electrode 6b of the piezoelectric resonator 4 is connected to the pattern electrode 3b by a lead wire 8.

In the piezoelectric component 1 having the structure described above, in order to obtain desired electrical characteristics, a plurality of factors including a resonant frequency, a degree of polarization and a capacitance between the terminals 6a, 6b of the piezoelectric resonator 4, and others, are determined according to component size requirements for the piezoelectric resonator 4 and intended working conditions.

The piezoelectric resonator has a specific mechanical quality factor Qm according to the piezoelectric material used. As a result, in order to obtain a desired value of Qm for a piezoelectric resonator, it has been necessary to develop an optimal piezoelectric material for achieving the desired value or a piezoelectric material capable of achieving a value close to the desired value of the electrical characteristics. A long period of time is usually required to develop such a specific optimal piezoelectric material. If a piezoelectric material capable of achieving a value of electrical characteristic which is not equal to but close to the desired value is used, it is necessary to tolerate a range of values of electrical characteristics which do not correspond to the desired electrical characteristics.

SUMMARY OF THE INVENTION

To solve the above-described problems, the preferred embodiments of the present invention provide a piezoelectric component which achieves a desired Qm by using presently available piezoelectric materials.

According to one preferred embodiment of the present invention, there is provided a piezoelectric component comprising at least one piezoelectric resonator adapted to generate vibration in a longitudinal vibration mode, a supporting substrate for supporting the piezoelectric resonator, and an elastic material provided as a filler between the piezoelectric resonator and the supporting substrate.

According to another preferred embodiment of the present invention, a piezoelectric component comprises at least one piezoelectric resonator adapted to generate vibration in a longitudinal vibration mode, a supporting substrate for supporting the piezoelectric resonator, and an elastic material provided on a surface of the piezoelectric resonator disposed opposite from another surface of the piezoelectric resonator which faces the supporting substrate.

According to still another preferred embodiment of the present invention, a piezoelectric component comprises at least one piezoelectric resonator adapted to generate vibration in a longitudinal vibration mode, a supporting substrate for supporting the piezoelectric resonator, a first elastic material element provided as a filler between the piezoelectric resonator and the supporting substrate, and a second elastic material element provided on a surface of the piezoelectric resonator disposed opposite to another surface of the piezoelectric resonator which faces the supporting substrate.

In the above-described piezoelectric components, the elastic material provided as a filler between the piezoelectric resonator and the supporting substrate may preferably comprise a rubber-like material and may be formed of an electroconductive material.

In the above-described piezoelectric components, a plurality of the piezoelectric resonators may be connected on the supporting substrate to form a ladder filter.

The vibration load on the piezoelectric resonator is increased by providing an elastic material between the piezoelectric resonator and the supporting substrate or on the surface of the piezoelectric resonator at a location remote from the supporting substrate or both between the piezoelectric resonator and the supporting substrate and on the surface the piezoelectric resonator located remote from the supporting substrate. If an electroconductive material is used as the rubber-like elastic material provided between the piezoelectric resonator and the supporting substrate, the reliability of electrical connection between electrodes disposed on the supporting substrate and the piezoelectric resonator is improved.

In the ladder filter formed by connecting a plurality of the piezoelectric resonators in a ladder arrangement, the vibration load on each piezoelectric resonator constituting the ladder filter can be easily adjusted by providing a rubber-like elastic material between the piezoelectric resonators and the supporting substrate or on the surfaces of the piezoelectric resonators at a location remote from the supporting substrate or both between the piezoelectric resonators and the supporting substrate and on the surfaces the piezoelectric resonators at a location remote from the supporting substrate.

According to the preferred embodiments of the present invention, the mechanical quality factor Qm of the piezoelectric resonator is effectively and significantly changed by increasing the vibration load on the piezoelectric resonator resulting from the presence of the elastic material. Accordingly, a piezoelectric component having the desired Qm is obtained by adjusting the amount of the rubber-like elastic material. The reliability of electrical connection between electrodes on the supporting substrate and the piezoelectric resonator is improved by using an electroconductive material as the elastic material between the piezoelectric resonator and the supporting substrate. Thus, improved characteristics of the piezoelectric component can be obtained. A ladder filter having a plurality of piezoelectric resonators and having improved characteristics can also be obtained by performing such Qm adjustment with respect to each piezoelectric resonator.

The above-described and other objects, features and advantages of the present invention will become apparent from the following detailed description of preferred embodiments of the invention with reference to the accompanying drawings.

DETAILED DESCRIPTION OF PREFERRED EMBODIMENTS

Figure 1:
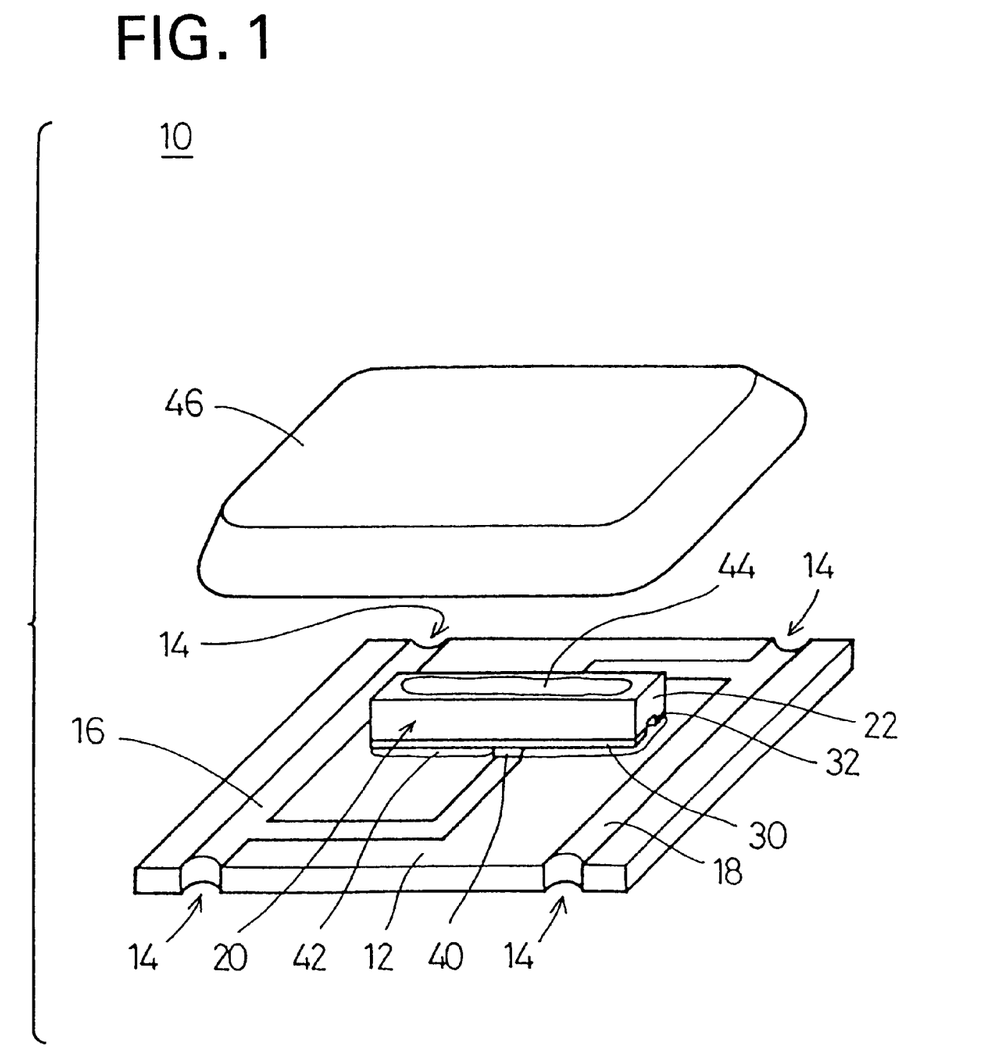
FIG. 1 is an exploded perspective view of a piezoelectric resonator which represents a preferred embodiment of the present invention.

FIG. 1 shows a piezoelectric component 10 which represents a preferred embodiment of the present invention. The piezoelectric component 10 includes a supporting substrate 12 preferably formed of an insulating material such as alumina or other suitable material. Two recesses 14 are preferably formed in each of two opposite side portions of the supporting substrate 12. Two pattern electrodes 16 and 18 are provided on one of two major surfaces of the supporting substrate 12. The pattern electrode 16 has a first portion disposed between one opposite pair of the recesses 14 and a second portion preferably having a shape of an L so as to extend along one of the above-mentioned opposite sides of the supporting substrate 12 and then toward a central portion of the supporting substrate 12. The pattern electrode 18 has a first portion disposed between the other opposite pair of the recesses 14 and a second portion preferably having an L shape so as to extend along the other of the opposite sides of the supporting substrate 12 and then toward the central portion of the supporting substrate 12.

The ends of the two pattern electrodes 16 and 18 preferably located substantially at the center of the supporting substrate 12 are formed so as to be opposed to and spaced apart from each other. The first portions of the pattern electrodes 16 and 18 are arranged so as to extend to positions on the other major surface of the supporting substrate 12 via the recesses 14.

Figure 2:
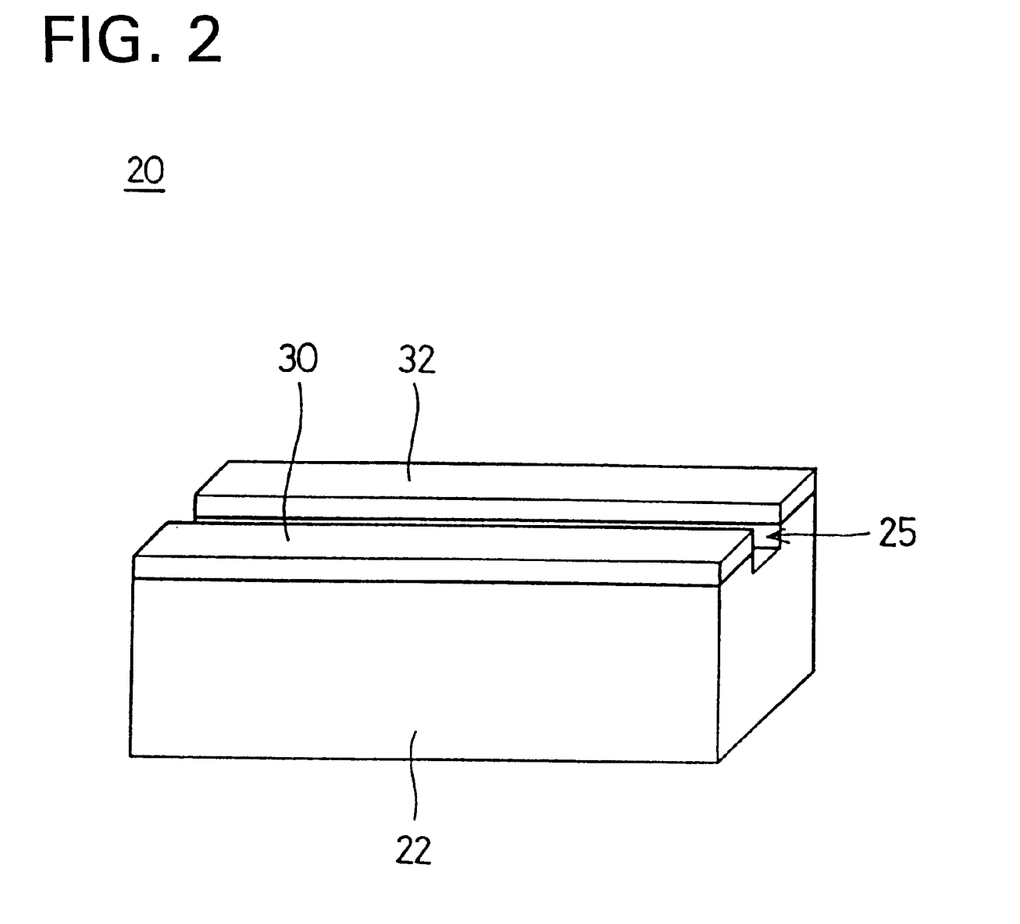
FIG. 2 is a perspective view of a piezoelectric resonator used in the piezoelectric component shown in FIG. 1.
Figure 3:
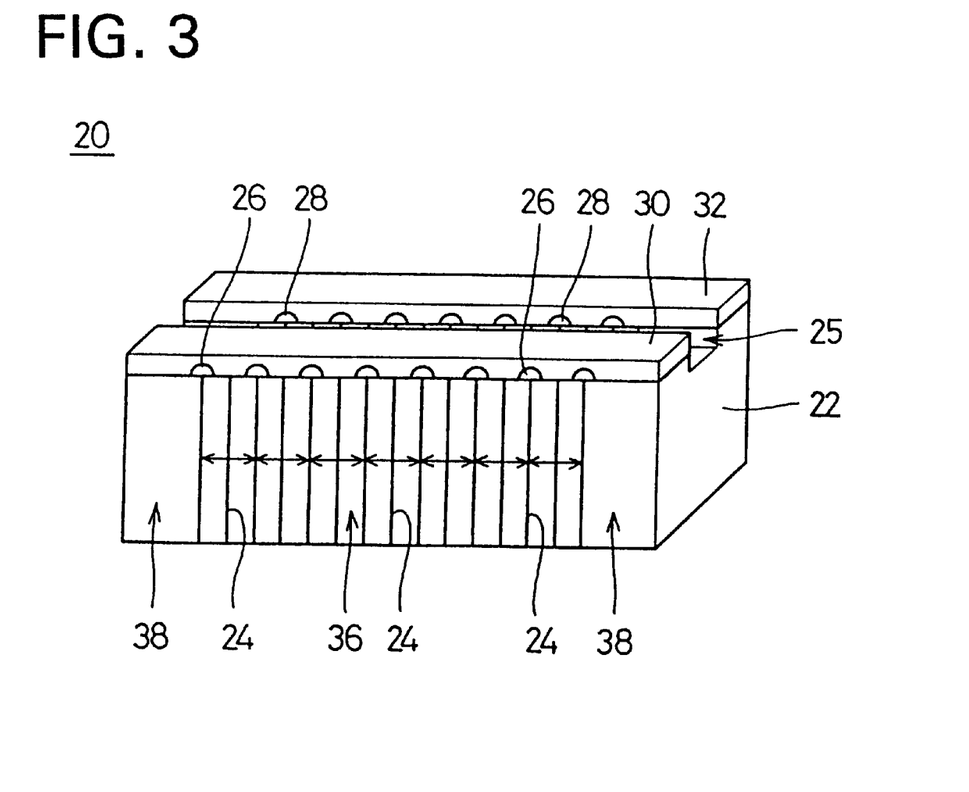
FIG. 3 is a diagram showing the structure of the piezoelectric resonator shown in FIG. 2.

A piezoelectric resonator 20 is mounted on the ends of the pattern electrodes 16 and 18 preferably substantially at the center of the supporting substrate 12. The piezoelectric resonator 20 includes a base member 22 having, for example, the shape of a substantially rectangular block, as shown in FIG. 2. The base member 22 is formed of, for example, a piezoelectric ceramic material. A plurality of internal electrodes 24 are disposed in the base member 22, as shown in FIG. 3. Each internal electrode 24 is arranged so that its major surfaces are substantially perpendicular to the longitudinal direction of the base member 22. The base member 22 is polarized along its longitudinal direction so that a pair of its portions on the opposite sides of each internal electrode 24 are polarized in opposite directions, as indicated by the arrows in FIG. 3. However, the base member 22 is preferably not polarized at the opposite ends so as to form a non-active portion.

Figure 4:
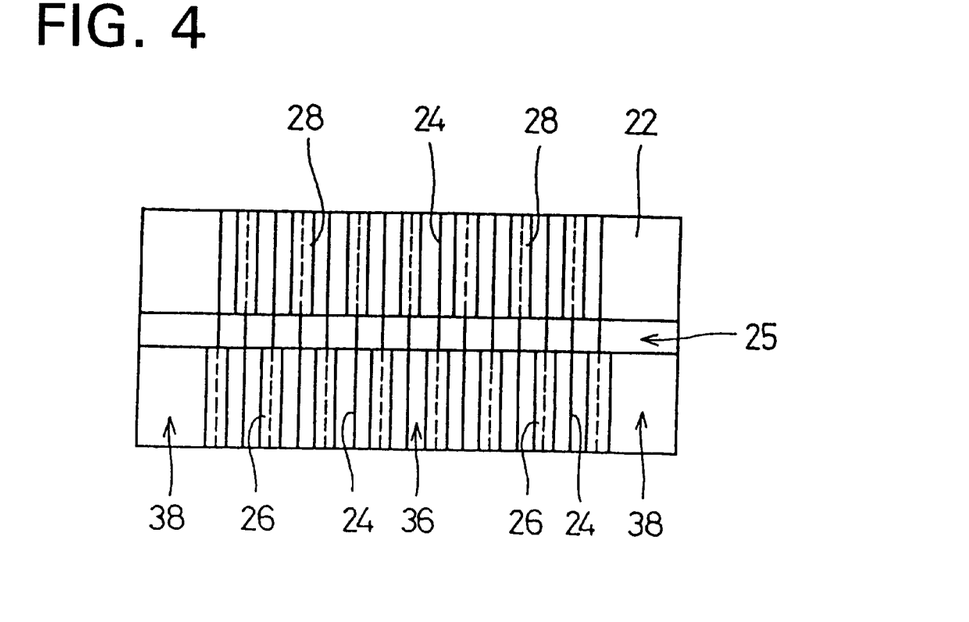
FIG. 4 is a plan view of a state in which insulating films are formed on a base member used in the piezoelectric resonator shown in FIG. 2.

In one side surface of the base member 22, a groove 25 is preferably formed so as to extend in the longitudinal direction of the base member 22. The groove 25 is formed at the center in the widthwise direction of the base member 22 to bisect the side surface of the base member 22. As shown in FIG. 4, on the side surface divided by the groove 25, a first insulating film 26 and a second insulating film 28 are provided. Edges of the internal electrodes 24 exposed at one of the two portions of the side surface of the base member 22 bisected by the groove 25 are alternately covered and left uncovered with the first insulating film 26. Edges of the internal electrodes 24 which are exposed at the other of the two portions of the side surface of the base member 22 bisected by the groove 25 and which are opposite from the edges of the internal electrodes 24 not covered with the first insulating film 16 are covered with the second insulating film 28.

Further, external electrodes 30 and 32 are preferably provided on the portions of the base member 22 on which the first and second insulating films 26 and 28 are disposed, i.e., on the opposite sides of the groove 25, so that the internal electrodes 24 not covered with the first insulating film 26 are connected to the external electrode 30 while the internal electrodes 24 not covered with the second insulating film 28 are connected to the external electrode 32. That is, in each adjacent pair of the internal electrodes 24, one of the pair of adjacent electrodes 14 is connected to the external electrode 30 or 32 while the other of the pair of adjacent electrodes is connected to the external electrode 32 or 30.

In this piezoelectric resonator 20, the external electrodes 30 and 32 are preferably used as input/output electrodes. When the piezoelectric resonator 20 is operated, an electric field is applied to the portion of the base member 22 located between each adjacent pair of the internal electrodes 24 defining a section of the base member 22 other than opposite end sections. The base member 22 is preferably thereby made piezoelectrically active in this section. However, the base member 22 is preferably not made piezoelectrically active in the opposite end sections because the base member 22 is not polarized in the opposite end sections and because no electric field is applied to the opposite end sections since no electrodes are formed on the opposite end surfaces of the base member 22. Thus, the central section of the base member 22 is preferably formed as an active section 36 which is activated by an input signal while the opposite end sections of the base member 22 are preferably formed as inactive sections 38 which are not activated by an input signal. Each inactive section 38 is defined as a section in which no driving force is generated in response to an input signal. Accordingly, an electric field may be applied to the portion of the base member 22 between each adjacent pair of the internal electrodes if the portion between the internal electrodes is not polarized. Also, a structure for inhibiting application of an electric field to some of the polarized piezoelectric layers may be used. It is not always necessary to form such inactive sections 38; the entire base member 22 may be formed as an active section.

The piezoelectric resonator 20 constructed as described above is mounted on the pattern electrodes 16 and 18 on the supporting substrate 12. At this time, the piezoelectric resonator 20 is connected to the pattern electrodes 16 and 18 by two supporting members 40 preferably formed of an electroconductive material. Portions of the external electrodes 30 and 32 of the piezoelectric resonator 20 located substantially at the approximate center in the longitudinal direction are connected to the supporting members 40. Gaps between the piezoelectric resonator 20 and the supporting substrate 12 are filled with an elastic, preferably rubber-like, material 42 such as silicone rubber or other suitable material or urethane. Further, rubber-like elastic material 44 is preferably also provided on the upper surface of the piezoelectric resonator 20. For these rubber-like elastic materials 42 and 44, a rubber-like elastic material having an insulating property, for example, is preferably used.

A metallic cap 46 is placed on the supporting substrate 12. To prevent the metal cap 46 from being short-circuited to the pattern electrodes 16 and 18, an insulating resin is preferably applied to the supporting substrate 12 and the pattern electrodes 16 and 18 in advance. By capping with the metallic cap 46, the manufacture of the piezoelectric component 10 is completed. In this piezoelectric component 10, the pattern electrodes 16 and 18 arranged to extend to the reverse surface of the supporting substrate 12 via the side surfaces of the supporting substrate 12 are used as input/output terminals for connection to an external circuit.

When a signal is input to this piezoelectric component 10 through the pattern electrodes 16 and 18, a voltage is applied in opposite directions to the piezoelectric layers in the active section 36 which is polarized in opposite directions, so that the piezoelectric layers expand and contract as an integral unit in the same direction. Vibration is thereby generated in the longitudinal fundamental mode with a node being defined at the approximate center of the base member 22.

In this piezoelectric component 10, the direction of polarization of the active section 36, the direction of each electric field according to a signal and the direction of vibration of the active section 36 are the same. That is, the piezoelectric resonator 20 is a stiffened type resonator. The stiffened piezoelectric resonator 20 has a larger electromechanical coupling coefficient than unstiffened piezoelectric resonators in which the direction of vibration does not coincide with the direction of polarization and the direction of an electric field. Therefore, the stiffened piezoelectric resonator 20 has a larger difference $\Delta F$ between the resonant frequency and the antiresonant frequency. As a result, the piezoelectric resonator 20 achieves wide-frequency-band characteristics.

In the piezoelectric resonator 20, $\Delta F$ can be adjusted to a suitable value, for example, by changing the proportions of the active section 36 and the inactive section 38 and/or by selecting a location of the inactive section 38 on the base member. The capacitance of the piezoelectric resonator 20 can be easily adjusted by changing the number of layers of the active section 36. Therefore, impedance matching between the piezoelectric component 10 and an external circuit can be achieved easily.

In any use of the piezoelectric component 10, e.g., use as a discriminator or an oscillator using one piezoelectric resonator 20 arranged as described above, a phase change at a frequency in the vicinity of the resonant frequency (Fr) and the antiresonant frequency (Fa) is utilized. However, if the mechanical quality factor Qm of the piezoelectric resonator 20 is unnecessarily large, a ripple due to unnecessary vibration occurs in the operating range which causes a severe negative effect on the resonator characteristics of the piezoelectric resonator 20. Therefore, suppression of Qm is important. Because Qm of the piezoelectric resonator 20 is determined by the piezoelectric material of the base member 22, QM cannot be controlled by selecting the size of the element, the number of piezoelectric layers and so on.

In this piezoelectric component 10, therefore, Qm is effectively controlled by the elastic material 42 filling the gaps between the piezoelectric resonator 20 and the supporting substrate 12 and the elastic material 44 preferably applied on the upper surface of the piezoelectric resonator 20. That is, the vibration load on the piezoelectric resonator 20 is increased by these elastic materials 42 and 44, thereby effectively and significantly suppressing Qm of the piezoelectric resonator 20. The desired value of Qm may be obtained by adjusting the amounts of the elastic materials 42 and 44 while measuring characteristics of the piezoelectric component 10.

It is not always necessary to use both the rubber-like elastic materials 42 and 44; only one of them may be used and still yield effective results. Use of only the rubber-like elastic material 42 filling the gaps between the piezoelectric resonator 20 and the supporting substrate 12 is more effective in suppressing Qm than use of only the elastic material provided on the upper surface of the piezoelectric resonator 20. This is because the elastic material 42 adheres both to the piezoelectric resonator 20 and to the supporting substrate 12 to effectively suppress vibration of the piezoelectric resonator 20. The elastic material 42 reinforces the support for the piezoelectric resonator 20. However, adjustment of Qm by applying the elastic material 44 on the upper surface of the piezoelectric resonator 20 is more easier to perform if Qm is adjusted while characteristics of the piezoelectric component 10 are being measured.

If the amounts of the elastic materials 42 and 44 are increased, the vibration load on the piezoelectric resonator 20 becomes larger and the Qm suppression effect becomes higher. When the piezoelectric resonator 20 vibrates, it has a larger displacement at its opposite ends since it vibrates in the longitudinal mode with a node being defined substantially at an approximate center of the base member 22. Accordingly, a portion of the rubber-like elastic material 42 or 44 located closer to each of the opposite ends of the piezoelectric resonator 20 contributes more largely to suppression of Qm.

Figure 5:
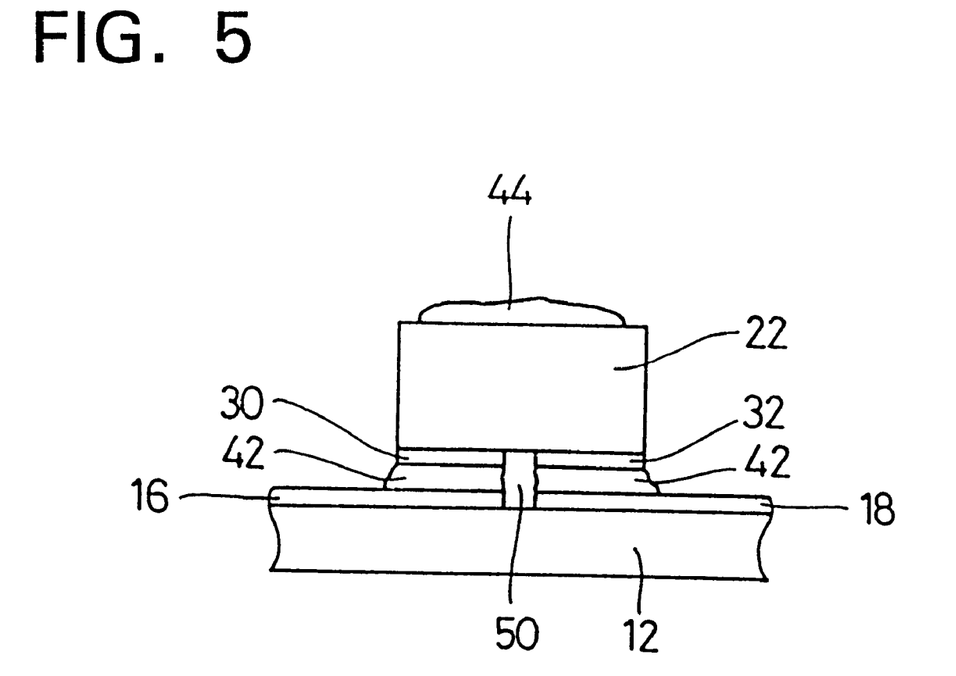
FIG. 5 is a diagram of the structure having an electroconductive elastic material between the piezoelectric resonator and the supporting substrate.

As the elastic material 42 between the piezoelectric resonator 20 and the supporting substrate 12, an electroconductive rubber-like elastic material such as electroconductive silicone may be used. If such a material is used, an insulating rubber-like elastic material 50 is provided as a filler at the recess 25 so as to prevent electrical conduction between the two external electrodes 30 and 32, as shown in FIG. 5. If such an electroconductive material is used as the elastic material 42, the reliability of each of the electrical connections between the external electrode 30 and the pattern electrode 16 and the electrical connections between the external electrode 32 and the pattern electrode 18 are improved.

Figure 6:
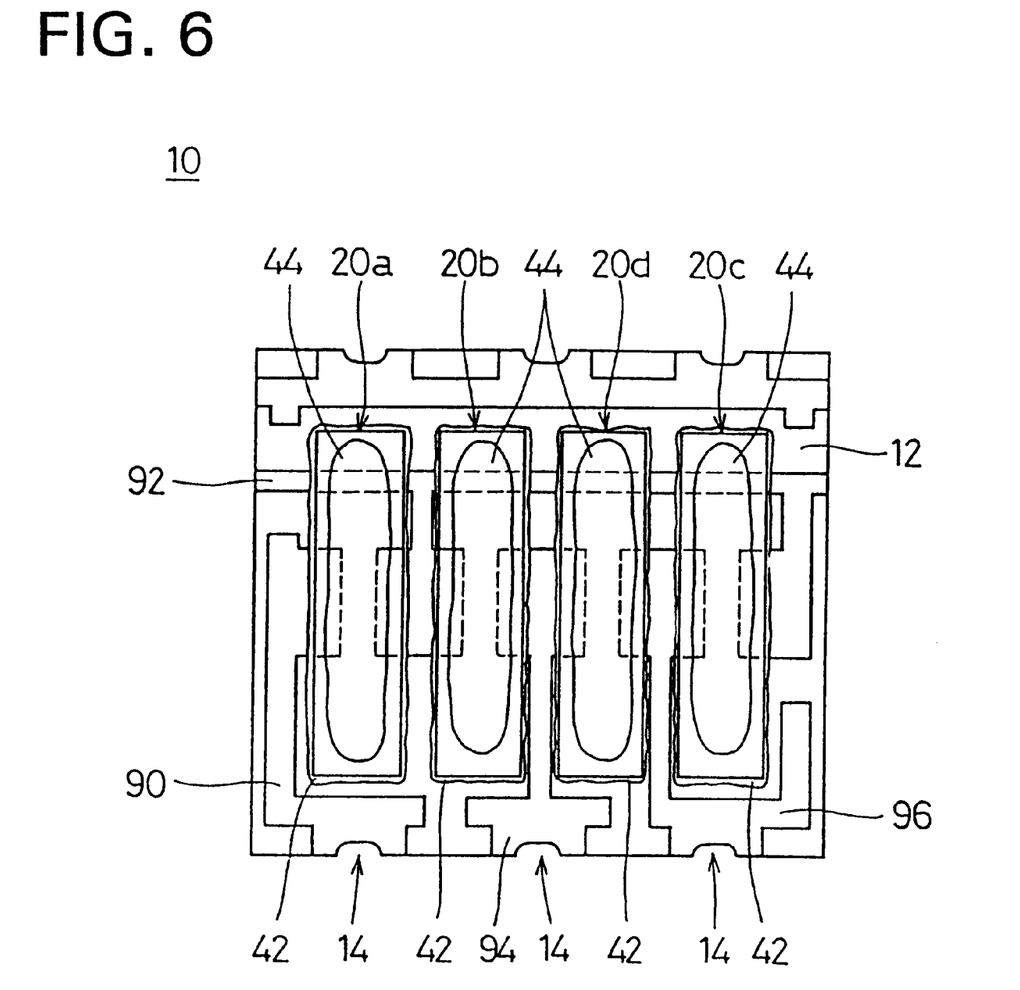
FIG. 6 is a plan view of an essential portion of a piezoelectric component using a plurality of piezoelectric resonators to form a ladder filter in accordance with a preferred embodiment of the present invention.
Figure 7:
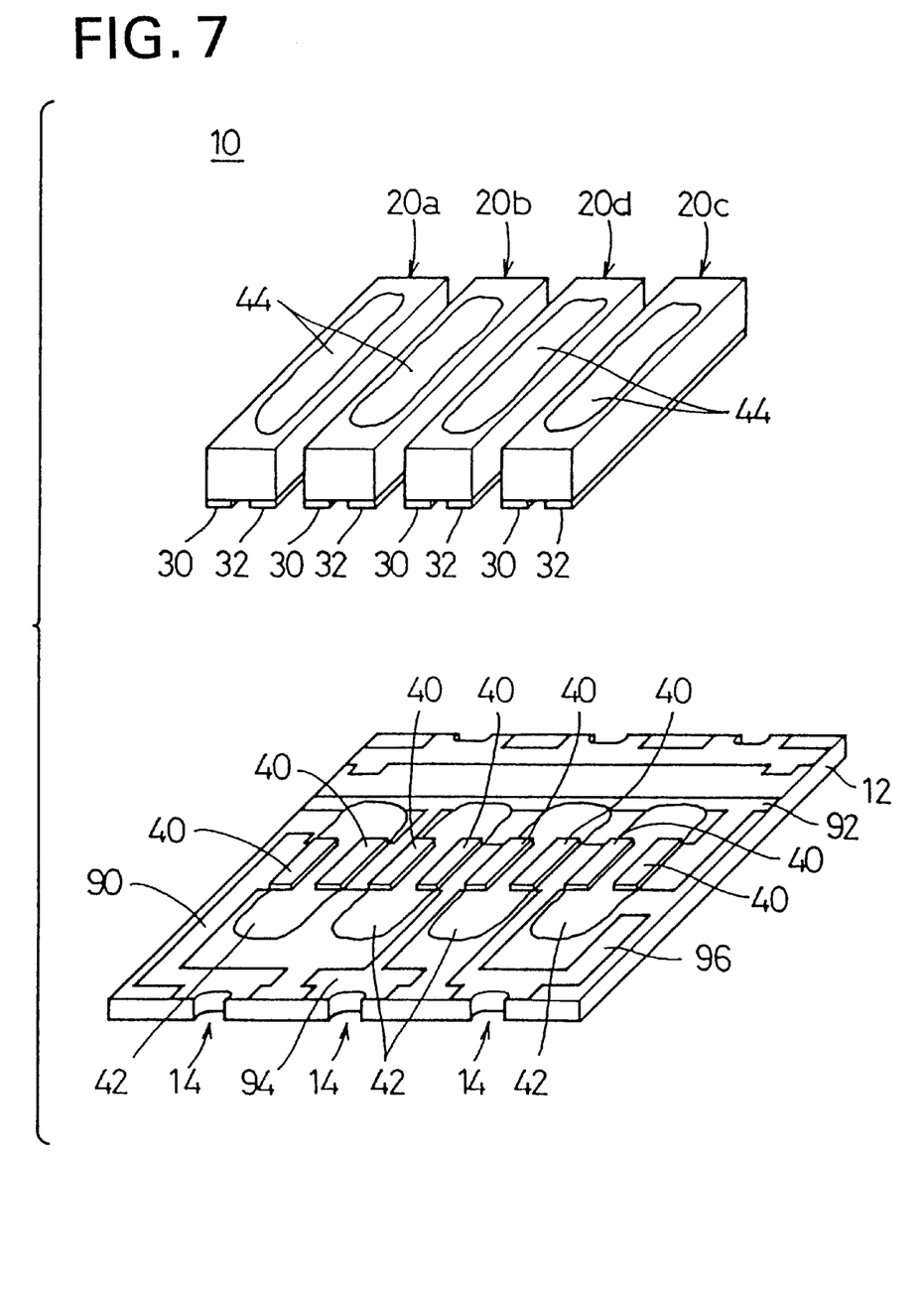
FIG. 7 is an exploded perspective view of the essential portion of the ladder filter shown in FIG. 6.

FIG. 6 is a plan view of an essential portion of a piezoelectric component 10 which represents another preferred embodiment of the present invention, and which is arranged as a ladder filter by using a plurality of piezoelectric resonators. FIG. 7 is a perspective view of the essential portion of this piezoelectric component 10. In this piezoelectric component 10, four pattern electrodes 90, 92, 94, and 96 are preferably provided on a supporting substrate 12. The pattern electrodes 90 to 96 have first to fifth lands arranged in a row in the direction from one end toward the other end of the supporting substrate 12 while being spaced apart from each other. The first land is formed as a portion of the pattern electrode 90, the second and fifth lands are formed as portions of the pattern electrode 92, the third land is formed as a portion of the pattern electrode 94, and the fourth land is formed as a portion of the pattern electrode 96.

External electrodes 30 and 32 of piezoelectric resonators 20a, 20b, 20c, and 20d are connected to these lands by supporting members 40. The piezoelectric resonators 20a, 20b, 20c, and 20d are mounted so as to form a ladder type circuit shown in FIG. 8. A metallic cap (not shown) is placed on the supporting substrate 12.

Figure 8:
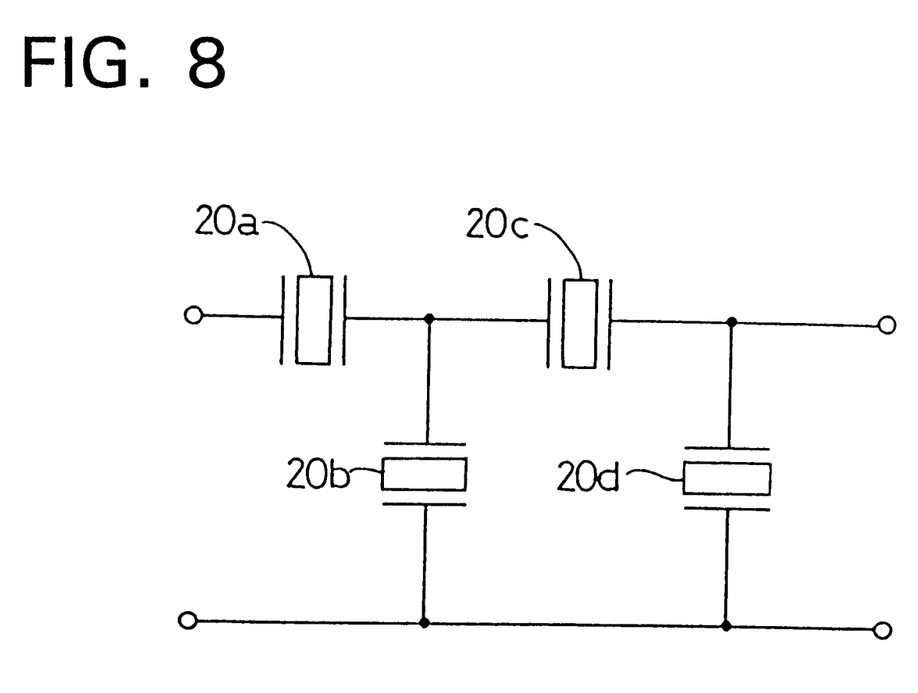
FIG. 8 is an equivalent circuit diagram of the ladder filter shown in FIG. 6.
Figure 9:
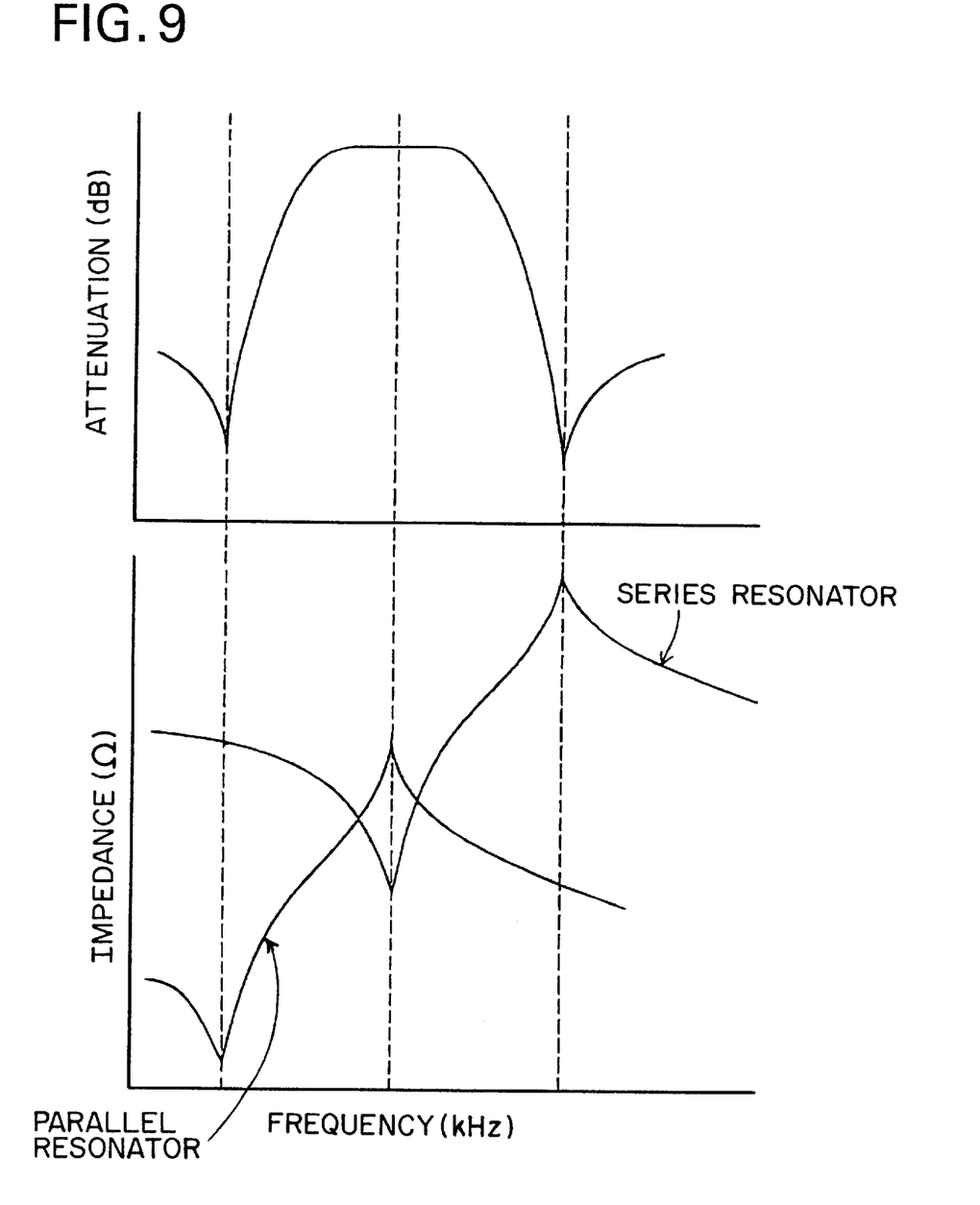
FIG. 9 is a graph showing the relationship between an attenuation characteristic and impedance characteristics of series and parallel resonators used in the ladder filter.

This piezoelectric component 10 is used as a ladder filter having a ladder type circuit such as shown in FIG. 8. To form such a ladder filter, two piezoelectric resonators 20a and 20c are used as series resonators while the other two piezoelectric resonators 20b and 20d are used as parallel resonators. Such a ladder filter is designed so that the parallel resonators 20b and 20d have much larger capacitances than the series resonators 20a and 20c. In a ladder filter, an attenuation characteristic is determined by an impedance characteristic of the series resonators 20a and 20c and an impedance characteristic of the parallel resonators 20b and 20d, as shown in FIG. 9.

Figure 10:
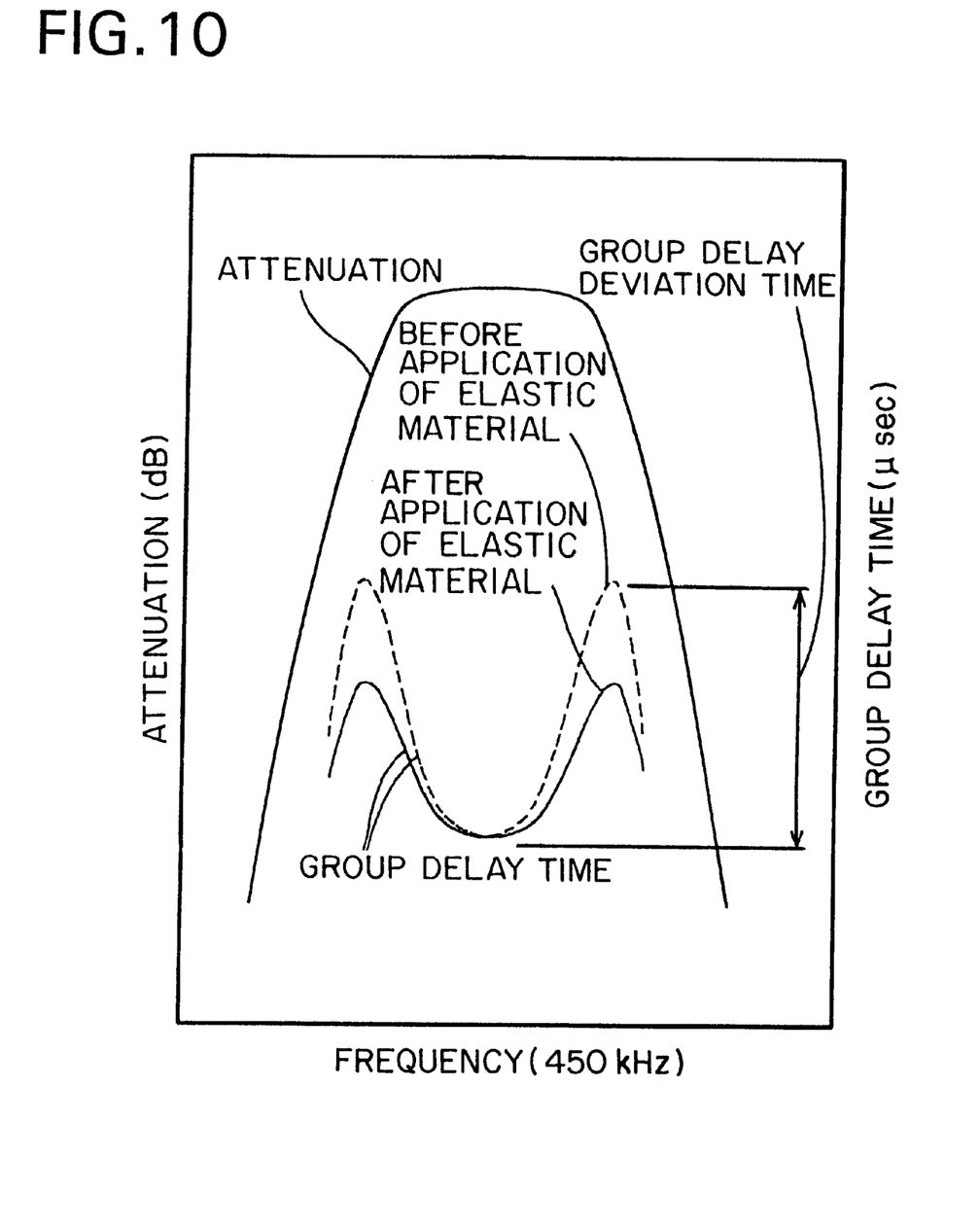
FIG. 10 is a graph showing characteristics of the ladder filter with respect to adjustment of Qm of both the series and parallel resonators.
Figure 11:
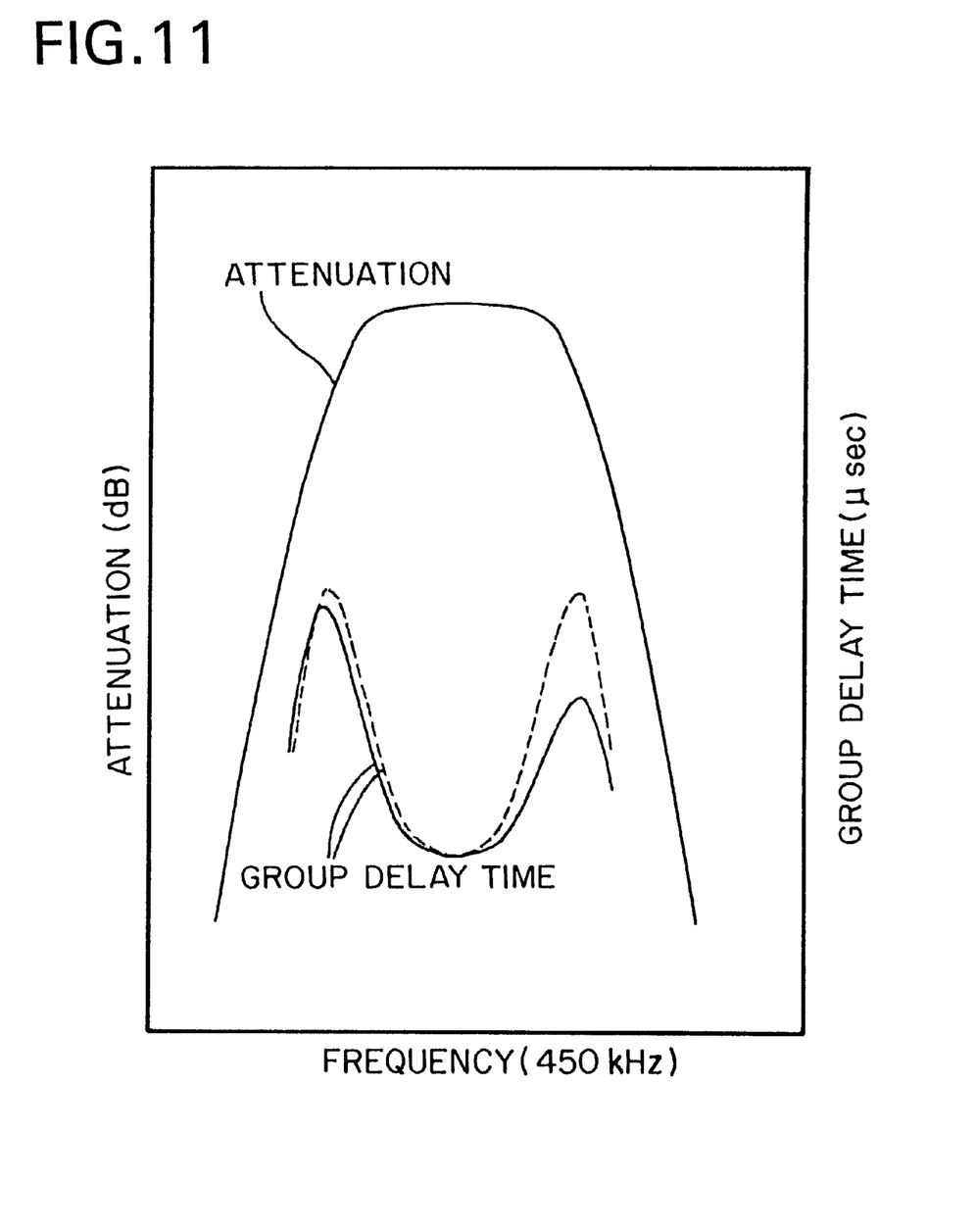
FIG. 11 is a graph showing characteristics of the ladder filter with respect to adjustment of Qm of the series resonators.
Figure 12:
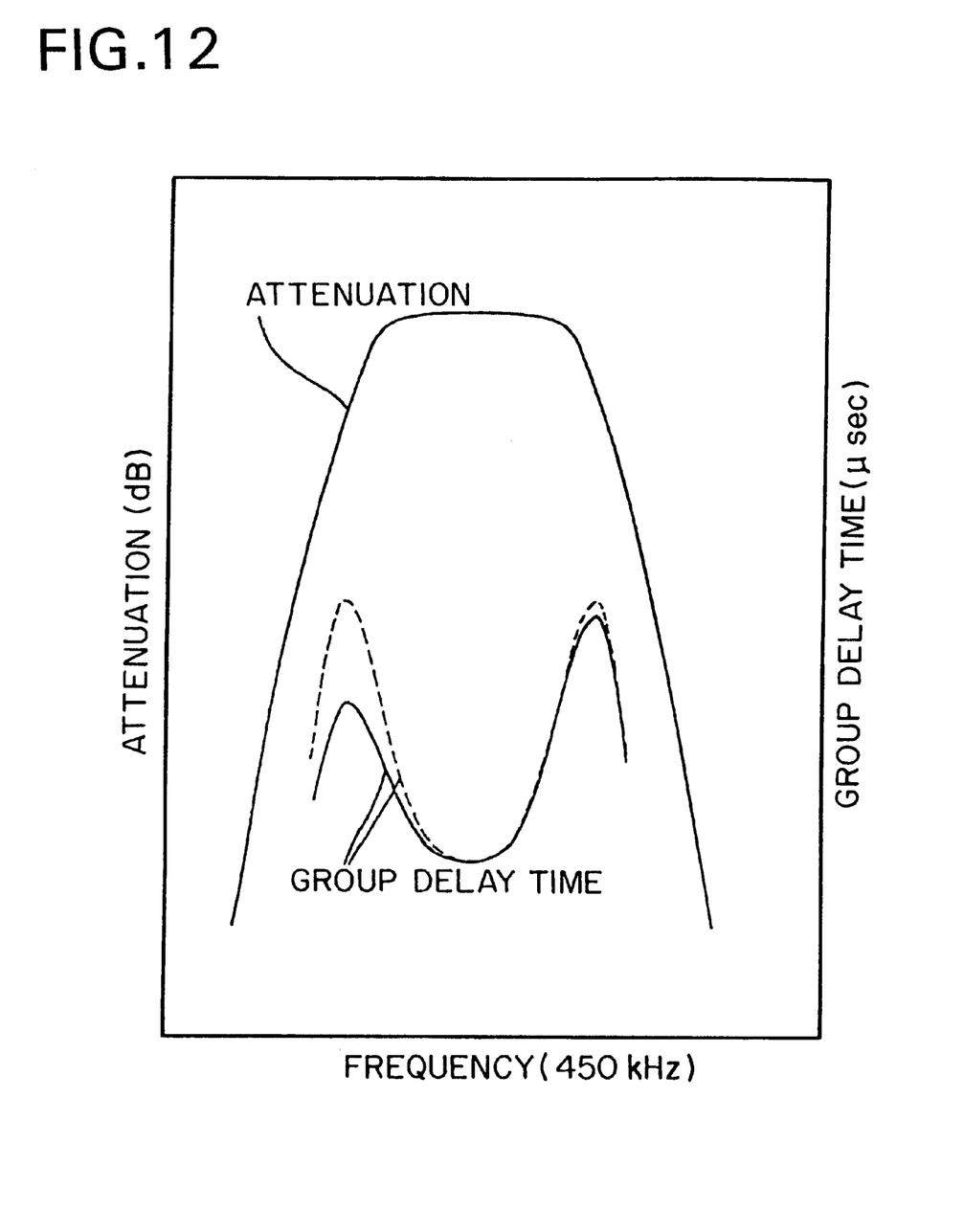
FIG. 12 is a graph showing characteristics of the ladder filter with respect to adjustment of Qm of the parallel resonators.

In such a ladder filter, a group delay characteristic (group delay time (GDT)) can be effectively controlled by controlling Qm of the piezoelectric resonators 20a to 20d through the provision and arrangement of the rubber-like elastic members 42 and 44. Characteristics of a ladder filter formed in the above-described manner were examined. FIG. 10 shows the characteristics when Qm of each of the series and parallel piezoelectric resonators 20a to 20d was suppressed. FIG. 11 shows the characteristics when Qm of each of the series piezoelectric resonators 20a and 20c was suppressed. FIG. 12 shows the characteristics when Qm of each of the parallel piezoelectric resonators 20b and 20d was suppressed. In FIGS. 10 to 12, the broken line indicates the group delay time before the application of the elastic materials while the solid line indicates the group delay time after the application of the elastic materials.

As can be understood from FIGS. 10, 11, and 12, GDT deviations can be improved by suppressing Qm of the piezoelectric resonators 20a to 20d, and the effect of improving GDT deviations is particularly high if the factors Qm of all the piezoelectric resonators 20a to 20d are suppressed. A change in amplitude characteristic of each resonator due to a change in Qm will not be discussed since it is very small.

As described above, if elastic materials 42 and 44 are used, the mechanical quality factor Qm is effectively controlled substantially without changing the piezoelectric material. While a stiffened type laminated piezoelectric resonator is used as piezoelectric resonator 20 in the above-described piezoelectric components 10, an unstiffened piezoelectric resonator in which the direction of vibration does not coincide with the direction of polarization and the direction of an electric field may alternatively be used. Also, in a case where such an unstiffened piezoelectric resonator capable of longitudinal vibration is used, Qm of the piezoelectric resonator can be controlled by the method of increasing the vibration load by using elastic members 42 and 44.

Also in a piezoelectric component using a piezoelectric resonator having external electrodes disposed on opposite surfaces of a base member and also using a lead wire as shown in FIG. 13, Qm of the piezoelectric resonator is controlled by filling the gaps between the piezoelectric resonator and the supporting substrate with an elastic material and/or by applying an elastic material on the upper surface of the piezoelectric resonator.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric component comprising:
   at least one piezoelectric resonator adapted to vibrate in a longitudinal vibration mode along a longitudinal axis of the at least one piezoelectric resonator, the at least one piezoelectric resonator comprising a single unitary resonator block including a laminated body of a plurality of piezoelectric layers and electrodes disposed between the piezoelectric layers;
   means for driving said at least one piezoelectric resonator for vibrating said at least one piezoelectric resonator such that a node point is defined approximately at a center point of the at least one piezoelectric resonator;
   a supporting substrate having a support surface for supporting said piezoelectric resonator in a manner such that the longitudinal axis along which the at least one piezoelectric resonator vibrates in the longitudinal vibration mode when driven by said means for driving is substantially parallel to the support surface of the supporting substrate; and
   an elastic material provided between said piezoelectric resonator and said supporting substrate.

2. A piezoelectric component according to claim 1, wherein said elastic material comprises an electroconductive material.

3. A piezoelectric component according to claim 1, wherein a plurality of said piezoelectric resonators are mounted on said supporting substrate and connected to each other so as to define a ladder filter.

4. A piezoelectric component according to claim 1, wherein said supporting substrate includes a plurality of pattern electrodes disposed on a surface of said supporting substrate, said plurality of pattern electrodes being electrically connected to said at least one piezoelectric resonator.

5. A piezoelectric component according to claim 1, wherein said base member includes a groove formed on a surface thereof and a pair of external electrodes mounted on said surface such that the groove is located between said pair of external electrodes.

6. A piezoelectric component according to claim 1, wherein said at least one piezoelectric resonator includes a base member having an active portion and at least one non-active portion.

7. A piezoelectric component comprising:

at least one piezoelectric resonator adapted to vibrate in a longitudinal vibration mode along a longitudinal axis of the at least one piezoelectric resonator, the at least one piezoelectric resonator comprising a single unitary resonator block including a laminated body of a plurality of piezoelectric layers and electrodes disposed between the piezoelectric layers and including a mounting surface and a top surface disposed opposite to said mounting surface, the mounting surface being located along one of side surfaces of the resonator;

means for driving said at least one piezoelectric resonator for vibrating said at least one piezoelectric resonator such that a node point is defined approximately at a center point of the at least one piezoelectric resonator, said node point of said at least one piezoelectric resonator being located along said mounting surface;

a supporting substrate supporting said piezoelectric resonator at said node point of said mounting surface of said at least one piezoelectric resonator; and an elastic material provided on said top surface of said piezoelectric resonator.

8. A piezoelectric component according to claim 7, wherein said elastic material comprises an electroconductive material.

9. A piezoelectric component according to claim 7, wherein a plurality of said piezoelectric resonators are mounted on said supporting substrate and connected to each other so as to define a ladder filter.

10. A piezoelectric component according to claim 7, wherein said supporting substrate includes a plurality of pattern electrodes disposed on a surface of said supporting substrate, said plurality of pattern electrodes being electrically connected to said at least one piezoelectric resonator.

11. A piezoelectric component according to claim 7, wherein said base member includes a groove formed on a surface thereof and a pair of external electrodes mounted on said surface such that the groove is located between said pair of external electrodes.

12. A piezoelectric component according to claim 7, wherein said at least one piezoelectric resonator includes a base member having an active portion and at least one non-active portion.

13. A piezoelectric component comprising:

at least one piezoelectric resonator adapted to vibrate in a longitudinal vibration mode along a longitudinal axis of the at least one piezoelectric resonator, the at least one piezoelectric resonator comprising a single unitary resonator block including a laminated body of a plurality of piezoelectric layers and electrodes disposed between the piezoelectric layers and including a mounting surface and a top surface disposed opposite to said mounting surface;

means for driving said at least one piezoelectric resonator for vibrating said at least one piezoelectric resonator such that a node point is defined approximately at a center point of the at least one piezoelectric resonator;

a supporting substrate having a support surface for supporting said piezoelectric resonator at said mounting surface such that the longitudinal axis of the at least one piezoelectric resonator is substantially parallel to the support surface; and a first elastic material element provided between said mounting surface of said at least one piezoelectric resonator and said supporting substrate, and a second elastic material element provided on said top surface of said piezoelectric resonator disposed opposite from said mounting surface of said piezoelectric resonator which faces said supporting substrate.

14. A piezoelectric component according to claim 13, wherein said first and second elastic material elements comprise an electroconductive material.

15. A piezoelectric component according to claim 13, wherein a plurality of said piezoelectric resonators are connected on said supporting substrate to define a ladder filter.

16. A piezoelectric component comprising:

at least one piezoelectric resonator adapted to vibrate in a longitudinal vibration mode along a longitudinal axis of the at least one piezoelectric resonator, said at least one piezoelectric resonator comprising a single unitary resonator block having a substantially longitudinal shape, a plurality of internal electrodes disposed in said resonator block and arranged to be substantially perpendicular to the longitudinal axis of said resonator block, and a pair of external electrodes disposed on one of a common side surface or different side surfaces of said resonator block so as to be connected to said plurality of internal electrodes, said single unitary resonator block including a laminated integral structure in which a plurality of piezoelectric layers and said plurality of internal electrodes are alternately arranged;

means for driving said at least one piezoelectric resonator for vibrating said at least one piezoelectric resonator by applying an AC electric field in the longitudinal direction of said resonator block to each of said piezoelectric layers via said plurality of electrodes so that longitudinal fundamental vibration is generated in said single unitary resonator block and such that a node point is defined approximately at a center point of said at least one piezoelectric resonator;

a supporting substrate having a support surface for supporting said piezoelectric resonator such that the longitudinal axis of the at least one piezoelectric resonator is substantially parallel to the support surface; and an elastic material provided between said piezoelectric resonator and said supporting substrate.

17. A piezoelectric component according to claim 16, wherein said elastic material comprises an electroconductive material.

18. A piezoelectric component according to claim 16, wherein a plurality of said piezoelectric resonators are connected on said supporting substrate to define a ladder filter.

* * * * *